United States Patent [19]
Yoshida

[11] Patent Number: 6,013,129
[45] Date of Patent: Jan. 11, 2000

[54] PRODUCTION OF HEAVILY-DOPED SILICON

[75] Inventor: Hiroshi Yoshida, Kawanishi, Japan

[73] Assignee: Japan Science and Technology Corporation, Japan

[21] Appl. No.: 09/136,554

[22] Filed: Aug. 19, 1998

[30] Foreign Application Priority Data

Aug. 20, 1997 [JP] Japan ................................. 9-223304

[51] Int. Cl.[7] .................................................. C30B 15/20
[52] U.S. Cl. .............................. 117/19; 104/108; 104/935
[58] Field of Search ............................. 117/19, 104, 108, 117/935

[56] References Cited

U.S. PATENT DOCUMENTS

| | | | |
|---|---|---|---|
| 5,100,832 | 3/1992 | Kitagawajetah et al. ............... | 187/311 |
| 5,169,798 | 12/1992 | Eoigleshamjetah et al. ........... | 438/493 |
| 5,190,891 | 3/1993 | Yokotsukajetah et al. ............. | 117/105 |

*Primary Examiner*—Felisa Garrett
*Attorney, Agent, or Firm*—Webb Ziesenheim Logsdon Orkin & Hanson, P.C.

[57] ABSTRACT

Provided is a method for the production of a heavily-doped silicon wherein an element X whose ionic radius is larger than Si and an element Y whose ionic radius is smaller than Si are added to a Si crystal growing atmosphere at an atomic ratio of $X:Y=1:(1+\alpha)$ or $X:Y=(1+\alpha):1$ with the proviso of $\alpha$ being a value of 1–5. When Si is double-doped with the elements X and Y, the number of carriers is increased up to $10^{20}$–$10^{22}$/cm$^3$. The double-doping may be adaptable to any of a pull method, an epitaxy method or a selective diffusion method. The double-doping remarkably increases the number of carriers, so as to produce metallic Si which can be useful itself as a wiring material due to its low resistivity.

6 Claims, 2 Drawing Sheets

○ silicon

⊘ a donor
(an atom whose ionic radius is larger than silicon)

(⃝) a strain

○ silicon

⊘ a donor
(an atom whose ionic radius is larger than silicon)

(⌒) a strain

○ silicon

● an acceptor
(an atom whose ionic radius is smaller than silicon)

⊘ a donor
(an atom whose ionic radius is larger than silicon)

PRODUCTION OF HEAVILY-DOPED SILICON

BACKGROUND OF THE INVENTION

The present invention relates to a method of producing a metallic Si single crystal having low resistivity useful as a substrate for semiconductor devices such as LSI or super LSI.

Si has been used as a substrate material for semiconductor devices such as LSI or super LSI. An n-type semiconductor having electrons serving as a carrier is obtained by doping Si with an n-type dopant, while a p-type semiconductor having holes serving as a carrier is obtained by doping Si with a p-type dopant. Each semiconductor is fabricated to a semiconductor device bestowed with various properties designed for a specified use.

When a circuit is built up between fabricated semiconductor devices, a thin metal film such as Au or Al useful for wiring is vapor-deposited on a Si substrate. However, Si itself can not be used as for wiring due to great resistivity even in case of n-type or p-type Si.

Minute wiring can not be formed from the thin metal film. Besides, metal atoms diffused from the thin film to a semiconductor region cause a deep level, resulting in reduction of carriers by recombination. In short, the metal film puts restriction on integration of semiconductor devices with high density. On the other hand, a demand for provision of semiconductor devices good of performance but small in size becomes stronger and stronger in these days. Such the demand can not be attained by conventional methods due to the restriction.

SUMMARY OF THE INVENTION

The present invention is aimed at provision of heavily-doped silicon which is useful itself for wiring semiconductors. The object of the present invention is to provide a metallic Si single crystal having resistivity sufficiently lowered to a level useful as wiring by double-doping Si with n-type and p-type dopants.

According to the present invention, n-type or p-type Si is produced by adding an element X whose ionic radius is larger than Si and an element Y whose ionic radius is smaller than Si to a Si single crystal growing atmosphere at an atomic ratio of $X:Y=1:(1+\alpha)$ or $X:Y=(1+\alpha):1$, so as to heavily-dope Si with high concentration of $10^{20}$–$10^{22}$/cm$^3$.

The growth of the heavily-doped Si single crystal may be performed by any of a pulling method, an epitaxy method or a selective diffusion method.

The pulling method uses a Si melt to which the elements X and Y are both added at the atomic ratio of $X:Y=1:(1+\alpha)$ or $X:Y=(1+\alpha):1$.

In the epitaxy method, molecular X and Y beams together with atomic Si beam are simultaneously ejected by MBE (a molecular beam epitaxy method), MOCVD (a metal organic chemical vapor deposition method) or the like for epitaxial growth.

In the selective diffusion method, vapor-deposited elements X and Y are both diffused to a substrate by annealing, so as to form a region double-doped with the elements X and Y.

The element X whose ionic radius is larger than Si may be one or more of P, As and Sb. The element Y whose ionic radius is smaller than Si may be one or more of B, Al, Ga and In. In the following explanation, P is representatively used as the element X, and B is representatively used as the element Y. However, such combination of the elements X and Y does not put any limitation on the scope of the present invention. The other combination of the elements X and Y also enables heavily-doping.

DETAILED DESCRIPTION OF THE INVENTION

Figure 1:
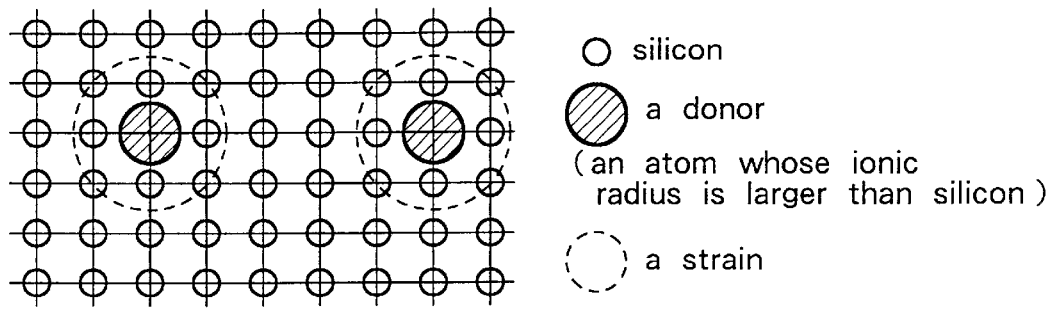
FIG. 1 is a schematic view illustrating a Si single crystal doped with sole P
Figure 2:
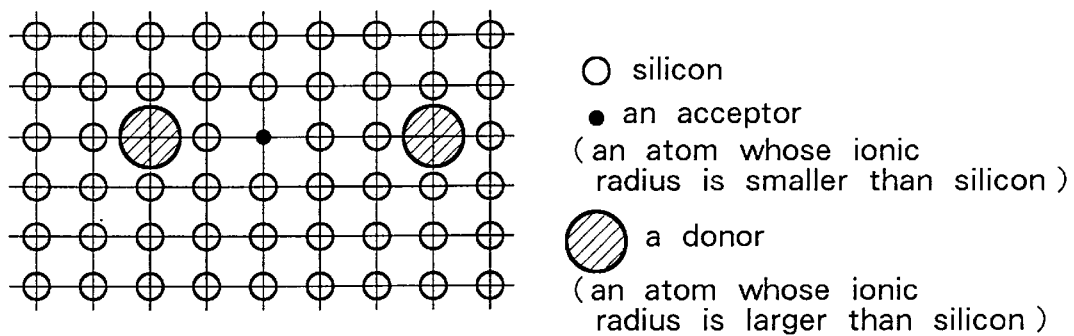
FIG. 2 is a schematic view illustrating a Si single crystal double-doped with P and B
Figure 3:
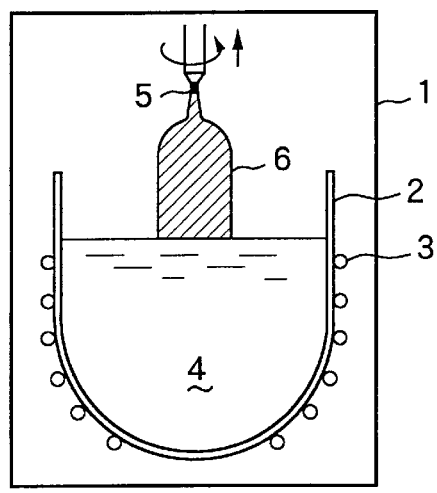
FIG. 3 is a schematic view for explaining a pulling method of producing a double-doped Si crystal from a Si melt

When Si is doped with sole P or B according to a conventional method, concentration of the dopant is approximately $10^{19}$/cm$^3$ at most. Even if much more amount of P or B is added to Si, number of carriers can not be increased due to increase of lattice defect. That is, since an substitutional atomic position of Si is not replaced by P or B, a trap center is realized due to appearance of atomic vacancy of Si and an atom is inserted to an interstitial position. As a result, resistivity of the doped Si is not lowered any more.

When Si is double-doped with P and B, concentration of the dopants can be increased to a level exceeding $10^{20}$/cm$^3$. The inventor suppose the effect of the double-doping on increase of concentration as follows:

When Si is double-doped with P (whose ionic radius is larger than Si) and B (whose ionic radius is smaller than Si), a strain energy of Si is relaxed so that Si can be heavily-doped up to high concentration without accumulation of strain. Consequently, the Si single crystal is heavily-doped up to high concentration without any lattice default.

In addition, the element X serving as a donor and the element Y serving as an acceptor are charged at positive (+) and negative (−) potentials, respectively, so as to enable coexistence of n-type and p-type dopants. A Coulomb force between the n-type and p-type dopants reduces an electrostatic energy, resulting in stabilization of crystallographic structure.

Double-doping with P and B at an atomic ratio of $(1+\alpha):1$ under such condition effectively promotes growth of a n-type Si crystal having low resistivity and including electrons as a carrier. While, double-doping with P and B at an atomic ratio of $1:(1+\alpha)$ promotes growth of a p-type Si crystal including holes as a carrier. Herein, the Si crystal can be heavily-doped up to high concentration exceeding $10^{20}$/cm$^3$, although compared concentration is approximately $10^{19}$/cm$^3$ or so at most by conventional sole P or B doping.

The Si crystal heavily-doped in this way exhibits metallic property but not dielectric property. That is, the heavily-doped Si has sufficiently low resistivity in an order of $10^{-2}$–$10^{-5}$ Ω-cm, so that the heavily-doped Si itself is useful as a wiring material for electrically connecting various semiconductor devices without necessity of a thin metal film such as Au or Al.

EXAMPLES

Example 1

A Si material was inserted in a crucible 2 located in a vacuum chamber 1. The Si material was heated up to 1550° C. by a high-frequency induction heater 3 and melted to prepare a Si melt 4. The Si melt 4 was mixed with P and B. Addition amount of P was adjusted at $6 \times 10^{20}$/cm³, $1 \times 10^{22}$/cm³, $2 \times 10^{22}$/cm³ and $6 \times 10^{22}$/cm³, while an amount of B was controlled to a half of an equivalency to the corresponding amount of P.

After the Si melt 4 became uniform, a seed crystal 5 was brought in contact with the Si melt 4. The seed crystal 5 was rotated and gradually lifted up at a speed of 1 cm/second to grow a Si single crystal 6 from the Si melt 4.

Each Si single crystal obtained in this way was tested to detect number of carriers. The results are shown in Table 1. It is noted from Table 1 that the Si crystal double-doped with P and B has number of carriers 100-times or much higher than that of a sole P-doped Si crystal without addition of B. Such heavily-doping is the typical effect of the double-doping with P and B and enables production of n-type metallic Si having low resistivity.

TABLE 1

EFFECTS OF DOUBLE-DOPING IN A PULLING METHOD

| AMOUNT OF P ADDED TO SILICON | NUMBER OF CARRIERS IN DOPED SILICON CRYSTAL (/cm³) | |
| --- | --- | --- |
| MELT (/cm³) | DOUBLE-DOPING WITH P AND B (P:B = 2:1) | SOLE P-DOPING |
| $6 \times 10^{20}$ | $2.1 \times 10^{20}$ | $3.1 \times 10^{18}$ |
| $1 \times 10^{22}$ | $2.8 \times 10^{21}$ | $2.6 \times 10^{19}$ |
| $2 \times 10^{22}$ | $3.5 \times 10^{21}$ | $3.4 \times 10^{19}$ |
| $6 \times 10^{22}$ | $1.1 \times 10^{22}$ | $4.2 \times 10^{19}$ |

Example 2

Figure 4:
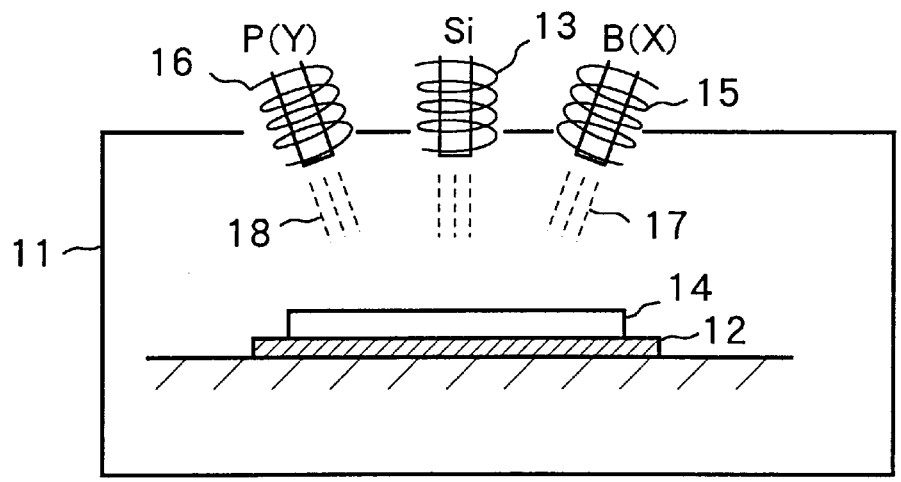
FIG. 4 is a schematic view for explaining a vapor deposition method of producing a Si crystal double-doped with P and B

A molecular beam epitaxy device was used in Example 2 for double-doping a Si layer, which was grown up according to a vapor-phase epitaxy method, with P and B. A Si substrate 12 was set in a vacuum chamber 11 held in an evacuated atmosphere at a degree of vacuum of $1.3 \times 10^{-8}$ Pa as shown in FIG. 4. An atomic Si beam activated by a high-frequency induction heater 13 was supplied to the vacuum chamber at a partial pressure of $1.3 \times 10^{-4}$ Pa, so as to epitaxially grow a Si crystal 14 on the Si substrate 12. At the same time, a B beam 17 and a P beam 18 each activated by heaters 15 and 16, respectively, were supplied to the vacuum chamber 11.

Each Si crystal 14 obtained in this way was tested to detect concentration of carriers. The results are shown in Table 2. It is noted from Table 2 that the Si crystal double-doped with P and B had concentration of carriers 100–500 times higher compared with that of sole P-doped Si without B-doping. These results also show the effect of the double-doping on increase of concentration and production of n-type metallic Si having low resistivity.

TABLE 2

EFFECTS OF DOUBLE-DOPING IN A VAPOR-PHASE DEPOSITION

| AMOUNT OF P ADDED TO SILICON (/cm³) | CONCENTRATION OR CARRIERS IN DOPED SILICON (/cm³) | |
| --- | --- | --- |
| | DOUBLE-DOPING WITH P AND B (P:B = 3:1) | SOLE P-DOPING |
| $1 \times 10^{21}$ | $5.0 \times 10^{20}$ | $4.2 \times 10^{18}$ |
| $1.5 \times 10^{22}$ | $3.0 \times 10^{21}$ | $5.6 \times 10^{19}$ |
| $1.5 \times 10^{23}$ | $3.1 \times 10^{22}$ | $6.2 \times 10^{19}$ |

Example 3

Figure 5:
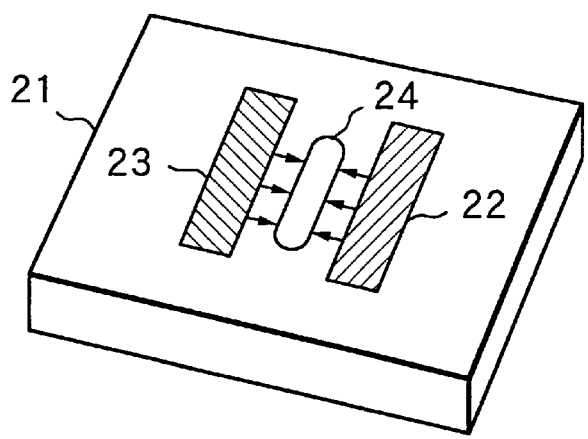
FIG. 5 is a schematic view for explaining a selective diffusion method of producing a Si crystal double-doped with P and B
Figure 6:
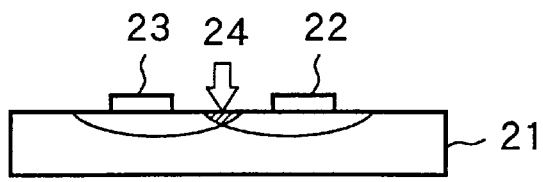
FIG. 6 is a schematic view illustrating a section of a Si single crystal substrate which has a region double-doped with P and B by diffusion

P serving as a donor 22 together with B serving as an acceptor 23 was vapor deposited on a Si single crystal substrate 21, as shown in FIG. 4. Thereafter, the substrate 21 was annealed at 1200° C. in a furnace to diffuse P and B into the Si crystal. Due to diffusion of P and B, a region 24 double-doped with P and B was formed in the Si single crystal substrate 21, as shown in FIG. 5.

Doping rates of P and B were varied by changing an annealing time. Each doped Si was tested to research the effect of the double-doping on number of carriers. The results are shown in Table 3, compared with sole P-doped Si without vapor deposition of B. It is noted from Table 3 that the Si crystal double-doped with P and B had number of carriers 100–350 times higher in comparison with the sole P-doped Si. These results are also the evidence that the double-doping with P and B remarkably increases number of carriers and enables production of n-type metallic Si having sufficiently low resistivity.

TABLE 3

EFFECTS OF DOUBLE DOPING WITH P AND B IN SELECTIVE DIFFUSION ON NUMBER OF CARRIERS

| ANNEALING | NUMBER OF CARRIERS IN DOPED SILICON CRYSTAL (/cm³) | |
| --- | --- | --- |
| TIME (hrs.) | DOUBLE-DOPING WITH P AND B (P:B = 2:1) | SOLE P-DOPING |
| 0.5 | $6.1 \times 10^{19}$ | $4.3 \times 10^{18}$ |
| 5 | $2.1 \times 10^{22}$ | $5.8 \times 10^{19}$ |

According to the present invention as aforementioned, a Si crystal is double-doped with an element X whose ionic radius is larger than Si and an element Y whose ionic radius is smaller than Si at an atomic ratio of 1:(1+α) or (1+α):1 with the proviso of α being a value of 1–5. The double doping remarkably increases number of carriers up to $10^{20}$–$10^{22}$/cm³, although number of carriers in a doped Si according to a conventional method is approximately $10^{19}$/cm³ or so at most. The Si heavily-doped in this way has sufficiently low resistivity as compared with conventional n-type or p-type Si. Due to the low resistivity, the double-doped Si itself is useful as a wiring material without deposition of a thin metal film such as Au or Al, and semiconductor devices can be integrated with extremely high density.

What is claimed is:

1. A method of producing a heavily-doped Si having a low resistivity, which comprises the steps of:
   adding an element X whose ionic radius is larger than Si and an element Y whose ionic radius is smaller than Si at an atomic ratio of X:Y=1:(1+α) or X:Y=(1+α):1 with the proviso of α being a value of 1–5 to a Si growing atmosphere so as to heavily dope Si with the elements X and Y at high concentration of $10^{20}$–$10^{22}$/cm$^3$.

2. The method defined by claim 1, wherein the elements X and Y are added at an atomic ratio of X:Y=1:(1+α) or X:Y=(1+α):1 to a Si melt, and a heavily-doped Si crystal is pulled up from said Si melt.

3. The method defined by claim 1, wherein the element X whose ionic radius is larger than Si and the element Y whose ionic radius is smaller than Si are simultaneously supplied as molecular beam together with a Si beams to a Si growing atmosphere during epitaxial growth of metallic Si from a vapor phase so as to double-dope an epitaxially growing Si crystal with the elements X and Y.

4. The method defined by claim 1, wherein the element X whose ionic radius is larger than Si and the element Y whose ionic radius is smaller than Si are vapor deposited on a Si single crystal substrate and then diffused by annealing so as to form thereon a region where Si is double-doped with the elements X and Y.

5. The method defined by claim 1, wherein the element X is at least one of P, As and Sb.

6. The method defined by claim 1, wherein the element Y is at least one of B, Al, Ga, and In.

* * * * *

UNITED STATES PATENT AND TRADEMARK OFFICE
CERTIFICATE OF CORRECTION

PATENT NO. : 6,013,129
DATED : January 11, 2000
INVENTOR(S) : Hiroshi Yoshida

It is certified that error appears in the above-identified patent and that said Letters Patent is hereby corrected as shown below:

Title Page, [56] References Cited, U.S. PATENT DOCUMENTS, insert the following:
--5,169,798    12/1992    Eaglesham et al.......438,493
   5,190,891    3/1993    Yokotsuka et al.......117/105--.

Column 5 Line 13, Claim 3, "beams" should read --beam--.

Signed and Sealed this

Twenty-eighth Day of November, 2000

Attest:

Q. TODD DICKINSON

*Attesting Officer*          *Director of Patents and Trademarks*